United States Patent [19]
Cuchiaro et al.

[11] Patent Number: 5,784,310
[45] Date of Patent: Jul. 21, 1998

[54] LOW IMPRINT FERROELECTRIC MATERIAL FOR LONG RETENTION MEMORY AND METHOD OF MAKING THE SAME

[75] Inventors: Joseph D. Cuchiaro; Narayan Solayappan; Carlos A. Paz de Araujo; Larry D. McMillan, all of Colorado Springs, Colo.

[73] Assignee: Symetrix Corporation, Colorado Springs, Colo.

[21] Appl. No.: 810,190

[22] Filed: Mar. 3, 1997

[51] Int. Cl.$^6$ ..................................................... G11C 11/22
[52] U.S. Cl. ........................... 365/145; 365/149; 365/171; 257/295; 252/519.13; 252/519.15; 428/692; 428/697; 428/702; 428/901; 361/321.5
[58] Field of Search ........................ 365/145, 149, 365/171; 257/295; 252/519.13, 519.15; 428/692, 697, 702, 332, 900, 901; 361/321.4, 321.5

[56] References Cited

U.S. PATENT DOCUMENTS

| | | | |
|---|---|---|---|
| 3,939,292 | 2/1976 | Rohrer | 427/55 |
| 5,478,610 | 12/1995 | Desu et al. | 427/573 |
| 5,495,438 | 2/1996 | Omura | 365/145 |
| 5,519,234 | 5/1996 | Paz de Araujo et al. | 257/295 |
| 5,527,567 | 6/1996 | Desu et al. | 427/573 |
| 5,539,279 | 7/1996 | Takeuchi et al. | 365/145 |
| 5,592,409 | 1/1997 | Nishimura et al. | 365/145 |
| 5,592,410 | 1/1997 | Verhaeghe et al. | 365/145 |
| 5,600,587 | 2/1997 | Koike | 365/145 |
| 5,708,302 | 1/1998 | Azuma et al. | 257/751 |

OTHER PUBLICATIONS

Paz de Araujo et al., "Fatigue-Free Ferroelectric Capacitors With Platinum Electrodes", Nature, vol. 374, Apr. 13, 1995, pp. 627–629.

Smolenskii, G.A. et al., "Ferroelectrics and Related Materials," vol. 3 of Ferroelectricity and Related Phenomena, Gordon & Breach Science Publishers, 1984, pp. 670–733.

Primary Examiner—David C. Nelms
Assistant Examiner—Andrew Q. Tran
Attorney, Agent, or Firm—Duft, Graziano & Forest, P.C.

[57] ABSTRACT

Thin film ferroelectric materials for use in integrated memory circuits, such as FERAMS and the like, contain strontium bismuth niobium tantalate having an empirical formula $SrBi_{2+E}(Nb_xTa_{2-x})O_{9+3E/2}$, wherein E is a number representing an excess amount of bismuth ranging from zero to 2; and X is a number representing an excess amount of niobium ranging from 0.01 to 0.9. The thin films demonstrate an exceptional resistance to polarization imprinting when challenged with unidirectional voltage pulses.

8 Claims, 7 Drawing Sheets

LOW IMPRINT FERROELECTRIC MATERIAL FOR LONG RETENTION MEMORY AND METHOD OF MAKING THE SAME

BACKGROUND OF THE INVENTION

1. Field of the Invention

The present invention pertains to thin film materials for use in integrated circuits and, more particularly, ferroelectric materials for use in integrated memory circuits. More specifically, the thin film ferroelectric materials are strontium bismuth niobium tantalate materials that remain essentially free of polarization imprinting even after long repetitions of unidirectional voltage pulses.

2. Statement of the Problem

It is well known that thin film ferroelectric materials may be used in a variety of nonvolatile random access memory devices. For example, U.S. Pat. No. 5,600,587 issued to Koike teaches a ferroelectric nonvolatile random access memory using memory cells consisting of a ferroelectric capacitor and a switching transistor. U.S. Pat. No. 5,495,438 issued to Omura teaches a ferroelectric memory that is formed of ferroelectric capacitors connected in parallel. The capacitors have ferroelectric materials of different coercive field values and, consequently, can use or store multi-value data. U.S. Pat. No. 5,592,409 issued to Nishimura et al teaches a nonvolatile memory including a ferroelectric layer that is polarized by the impressed voltage between two gates. The polarization or memory storage state is read as a high or low current flow across the ferroelectric layer, which permits nondestructive readout. U.S. Pat. No. 5,539,279 issued to Takeuchi et al teaches a high speed one transistor-one capacitor ferroelectric memory that switches between two modes of operation including a dynamic random access memory ("DRAM") mode and a ferroelectric random access memory ("FERAM") mode.

FIG. 1 depicts an ideal polarization hysteresis curve 100 for ferroelectric thin films. Side 102 of curve 100 is produced by measuring the charge on a ferroelectric capacitor while changing the applied field E from a positive value to a negative value. Side 104 of curve 100 is produced by measuring the charge on the ferroelectric capacitor while changing the applied field E from a negative value to a positive value. The points $-E_c$ and $E_c$ are conventionally referred to as the coercive field that is required to bring polarization P to zero. Similarly, the remanent polarization Pr or $-$Pr is the polarization in the ferroelectric material at a zero field value. The Pr and $-$Pr values ideally have the same magnitude, but the values are most often different in practice. Thus, polarization measured as 2Pr is calculated by adding the absolute values of the actual Pr and $-$Pr values even though these values may differ in magnitude. The spontaneous polarization values Ps and $-$Ps are measured by extrapolating a linear distal end of the hysteresis loop, e.g., end 106, to intersect the polarization axis. In an ideal ferroelectric, Ps equals Pr, but these values differ in actual ferroelectrics due to linear dielectric and nonlinear ferroelectric behavior. A large, boxy, substantially rectangular central region 108 shows suitability for use as a memory by its wide separation between curves 102 and 104 with respect to both coercive field and polarization.

Presently available ferroelectric materials depart from the ideal hysteresis shown in FIG. 1. Researchers have investigated materials for use in integrated ferroelectric devices since the 1970's, but these investigations have not yet been commercially successful due to their departures from the ideal hysteresis. For example, U.S. Pat. No. 3,939,292 issued to Rohrer reports early studies of ferroelectric materials for use in ferroelectric memories were performed on Phase III potassium nitrate. In practice, potassium nitrate materials have such low polarizabilities and are so badly afflicted by fatigue and imprint that the materials are practically useless in microelectronic memories.

It is nearly impossible to find ferroelectrics that meet commercial requirements. The best materials for integrated ferroelectric devices are switched using a coercive field that can be obtained from conventional integrated circuit operating voltages, i.e., three to five volts. The materials should have a very high polarization, e.g., one exceeding twelve to fifteen $\mu C/cm^2$ determined as 2Pr, to permit the construction of memories having sufficient densities. Polarization fatigue should be very low or nonexistent. Furthermore, the ferroelectric material should not imprint, i.e., the hysteresis curve should not shift to favor a positive or negative coercive field.

FIG. 2 depicts a hysteresis curve 100 next to curve 200. Curve 200 shows the effect of fatigue on curve 100. Fatigue reduces the separation between curves 102 and 104 defining central region 108. Central region 108 progressively becomes smaller and smaller with additional fatigue. This change in separation is due to the creation of point charge defects arising in the ferroelectric material as a consequence of polarization switching and the associated screening effect of the defects on the applied field. Thus, fatigue causes the ferroelectric material to wear out over time due to repeated polarization switching.

U.S. Pat. No. 5,519,234 issued to Araujo et al teaches that the fatigue problem of curve 200 is substantially overcome by the use of layered superlattice materials, such as the "layered perovskite-like" materials described in Smolenskii et al "Ferroelectrics and Related Materials," Gordon and Breach (1984). The layered superlattice materials are capable of providing a thin film ferroelectric material wherein the polarization state may be switched up to at least $10^9$ times with less than thirty percent fatigue. This level of fatigue endurance provides a significant advance in the art because it is at least an order of magnitude better than the fatigue endurance of other ferroelectrics, e.g., lead zirconium titanate ("PZT") or lead lanthanum zirconium titanate ("PLZT").

According to section 15.3 of the Smolenskii book, the layered perovskite-like materials or layered superlattice materials have three general classes:

(A) compounds having the formula $A_{m-1}Bi_2M_mO_{3m+3}$, where A=$Bi^{3+}$, $Ba^{2+}$, $Sr^{2+}$, $Ca^{2+}$, $Pb^{2+}$, $K^+$, $Na^+$ and other ions of comparable size, and M=$Ti^{4+}$, $Nb^{5+}$, $Ta^{5+}$, $Mo^{6+}$, $W^{6+}$, $Fe^{3+}$ and other ions that occupy oxygen octahedra;

(B) compounds having the formula $A_{m+1}M_mO_{3m+1}$, including compounds such as strontium titanates $Sr_2TiO_4$, $Sr_3Ti_2O_7$ and $Sr_4Ti_3O_{10}$; and (C) compounds having the formula $A_mM_mO_{3m+2}$, including compounds such as $Sr_2Nb_2O_7$, $La_2Ti_2O_7$, $Sr_5TiNb_4O_{17}$, and $Sr_6Ti_2Nb_4O_{20}$.

Smolenskii pointed out that the perovskite-like layers may have different thicknesses, depending on the value of m, and that the perovskite $AMO_3$ is in principal the limiting example of any type of layered perovskite-like structure with m=infinity. Smolenskii also noted that if the layer with minimum thickness (m=1) is denoted by P and the bismuth-oxygen layer is denoted by B, then the type I compounds may be described as ... $BP_mBP_m$ .... Further Smolenskii noted that if m is a fractional number then the lattice contains perovskite-like layers of various thicknesses, and that all the known type I compounds are ferroelectrics.

Despite the tremendous improvements in low fatigue ferroelectrics attributable to layered superlattice materials, there remains an imprint problem that is typified by curve 202 of FIG. 2. Curve 202 shows that curve 100 can be imprinted or shifted to the right or left. This imprinting occurs when the ferroelectric material is subjected to repetitive unidirectional voltage pulses. The ferroelectric material retains a residual polarization or bias that shifts sides 102 and 104 in a positive or negative direction with respect to the applied field. Thus, curve 202 has been shifted in a positive direction 204 by repeated negative pulsing of a ferroelectric capacitor. A shift in the opposite direction could also occur due to repetitive pulsing by negative voltage. This type of pulsing represents what happens to the ferroelectric materials as a consequence of repeated unidirectional voltage cycling, such as the sense operations in FERAMs. Imprint can be so severe that the ferroelectric material can no longer retain a binary polarization state corresponding to a logical 1 or 0 value.

U.S. Pat. No. 5,592,410 issued to Verhaeghe refers to ferroelectric imprint phenomenon as 'compensation.' The '410 patent teaches that the imprint problem can be reversed by pulsing voltage during the write cycle to return the hysteresis loop towards the unimprinted position of FIG. 100, as compared to curve 202. Thus, the imprint problem is reversed by special write operations in which the pulsed voltage is opposite the switching voltage. Still, the recommended voltage pulsing does not address the entire problem because the imprint phenomenon is a partially irreversible one. The observed imprinting reflects corresponding changes in microstructure of the ferroelectric crystal, e.g., the creation of point charge defects with associated trapping of polarized crystal domains. These changes in microstructure are not all reversible.

There remains a need for ferroelectric thin film materials that are substantially free of the imprint problem.

SOLUTION

The present invention overcomes the problems that are mentioned in the discussion above by providing a ferroelectric thin film which remains essentially free of imprint when it is used under normal integrated circuit operating conditions, i.e., at voltages ranging from ±3–5 volts or less and temperatures ranging from 0° C. to 200° C. The ferroelectric thin film is useful in integrated circuit memories and provides exceptionally high polarization with boxy hysteresis characteristics. Thin film ferroelectric materials according to the invention have less than about ten percent imprint while withstanding up to at least $10^{10}$ unidirectional voltage pulses.

Electronic devices having a thin film ferroelectric materials according to the present invention are essentially imprint-free. This improvement derives from the use of strontium bismuth niobium tantalate as the thin film ferroelectric material. The strontium bismuth niobium tantalate has an empirical formula

$$SrBi_{2+E}(Nb_xTa_{2-x})O_{9+3E/2}, \qquad (1)$$

wherein E is a number representing a stoichiometric excess amount of bismuth ranging from zero to 2; and X is a number representing an amount of niobium ranging from 0.01 to 0.9. X more preferably ranges from 0.4 to 0.8, and is most preferably 0.56. E can range from 0 to 2, and is most preferably 0.18. Formula (1) corresponds to the Smolenskii formula of class A wherein the A-site metal is strontium, the B-site metals are niobium and tantalum, and m=2, except formula (1) has an additional amount of bismuth E to compensate the solution for anticipated bismuth defects. The thin film ferroelectric material is preferably less than about 6000 Å thick, and is more preferably less than about 4000 Å thick, with the most preferred thickness being about 2000 Å. It is difficult to make films having thicknesses less than about 500 Å to 600 Å because shorting problems reduce the device yield. These shorting problems involve surface irregularities on the electrodes, as well as grain size constraints under high temperature anneal conditions.

The strontium bismuth niobium tantalate films exhibit superior resistance against imprint in the intended environment of use within integrated circuits. For example, preferred devices at 125° C. can withstand over $10^{10}$ unidirectional voltage pulse cycles each having a magnitude ranging from three to five volts cycles with less than 20% imprint determined as Psn-Psu. Similarly, the preferred devices at 125° C. can withstand over $10^9$ unidirectional voltage pulse cycles each having a magnitude ranging from three to five volts cycles with less than 5% imprint determined as Psn-Psu.

Other features, objects, and advantages will become apparent to those skilled in the art upon reading the detailed description below in combination with the accompanying drawings.

DETAILED DESCRIPTION OF THE PREFERRED EMBODIMENT

Figure 3:
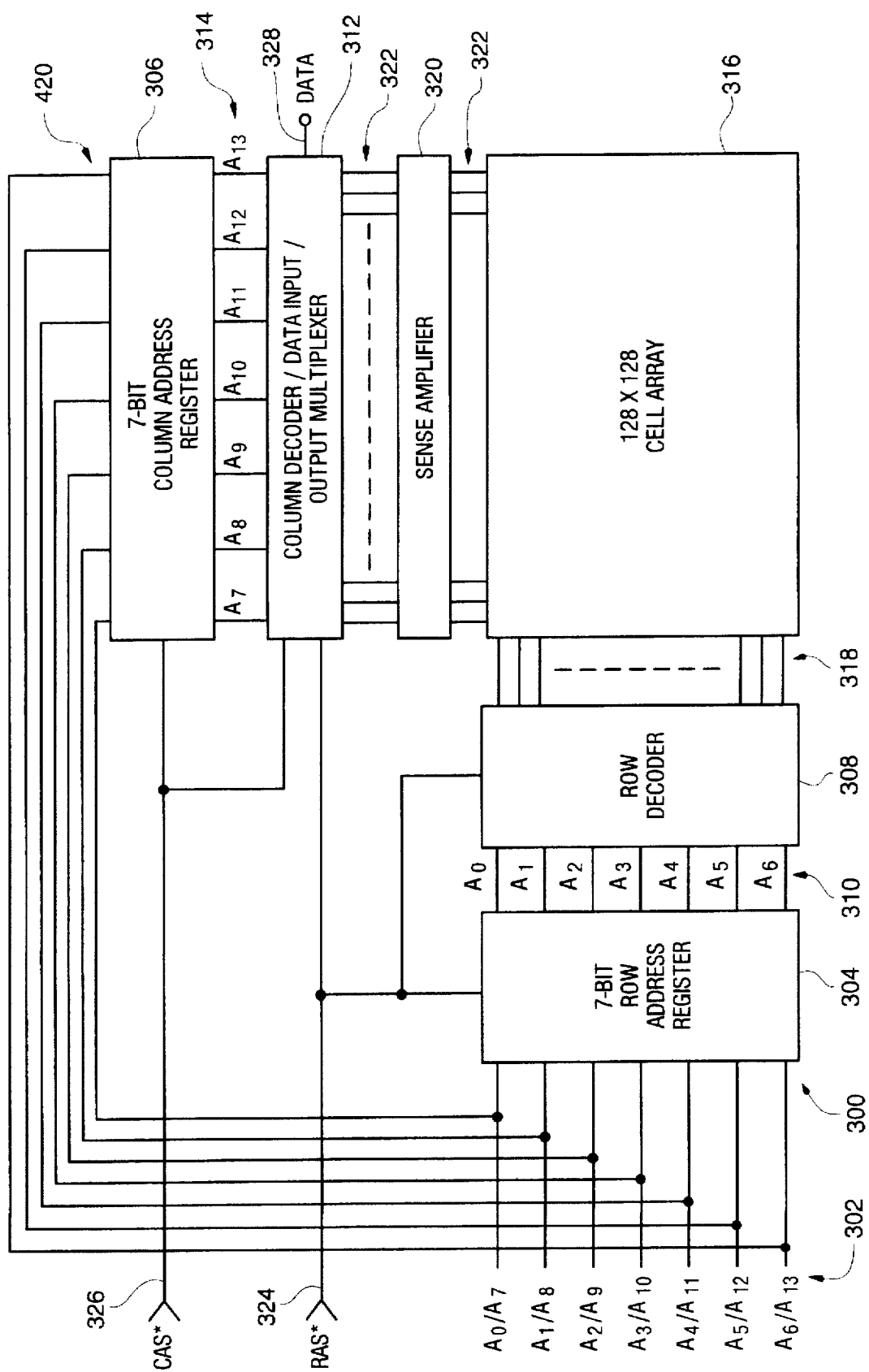
FIG. 3 depicts a circuit diagram of an integrated circuit memory which is a preferred use of the strontium bismuth niobium tantalate thin film ferroelectric material according to the invention.

FIG. 3 is a block diagram illustrating an exemplary integrated circuit memory 300 in which ferroelectric switching capacitors or high dielectric constant capacitors made with the materials of the invention are utilized. For simplicity, the embodiment shown is for a 16K×1 DRAM; however the material may be utilized in a wide variety of sizes and types of memories, both volatile and non-volatile. In the 16K embodiment shown, there are seven address input lines 302 which connect to a row address register 304 and a column address register 306. The row address register 304 is connected to row decoder 308 via seven lines 310, and the column address register 306 is connected to a column decoder/data input output multiplexer 312 via seven lines 314. The row decoder 308 is connected to a 128×128 memory cell array 316 via 128 lines 318, and the column decoder/data input output multiplexer 312 is connected to the sense amplifiers 320 and memory cell array 316 via 128 lines 322. A RAS* signal line 324 is connected to the row address register 304, row decoder 308, and column decoder/data input/output multiplexer 312, while a CAS* signal line 326 is connected to the column address register 306 and column decoder/data input output multiplexer 312. (In the discussion herein, a indicates the inverse of a signal.) An input/output data line 328 is connected to the column decoder/data input output multiplexer 312. Memory cell array 316 contains 128×128=16,384 memory cells, which is conventionally designated as 16K. These cells are ferroelectric switching capacitor-based cells according to the present invention.

Figure 4:
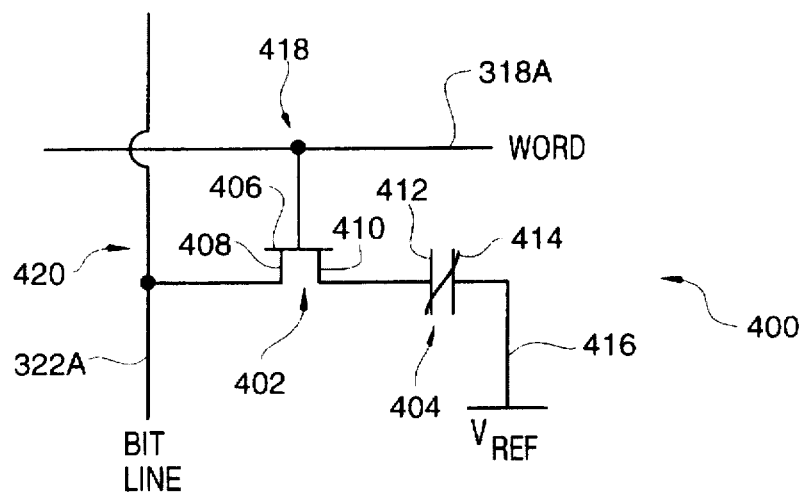
FIG. 4 depicts a circuit diagram of an individual integrated circuit non-volatile memory cell such as may be used in the memory of FIG. 3 and utilizing the strontium bismuth niobium tantalate thin film ferroelectric material according to the invention.

FIG. 4 depicts a ferroelectric capacitor-based switching cell 400. Cell 400 includes two electrically interconnected electrical devices, namely, a transistor 402 and a ferroelectric switching capacitor 404. The gate 406 of transistor 402 is connected to line 318A, which is one of the lines 318 (see FIG. 3) which are generally called "word lines". Source/drain 408 of transistor 402 is connected to line 322A, which is one of lines 322 that are generally called "bit lines". The other source/drain 410 of transistor 402 is connected to electrode 412 of switching capacitor 404. The other electrode 414 of switching capacitor 404 is connected to line 416 which is connected to a reference voltage $V_{ref}$.

Figure 5:
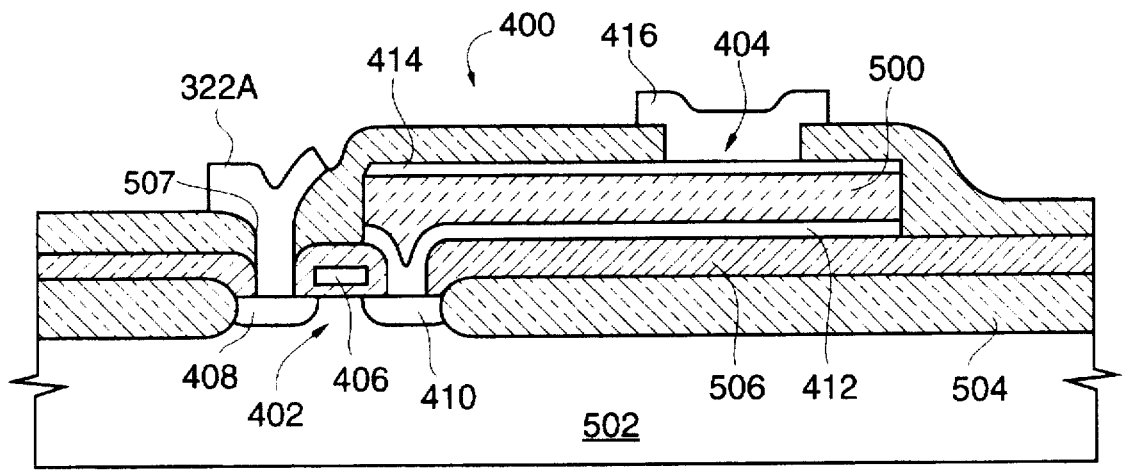
FIG. 5 depicts a layered construction showing how individual memory cells may be implemented in an integrated circuit memory corresponding to FIGS. 3 and 4.

Cell 400 may be fabricated as an integrated circuit, as shown in FIG. 5. The individual elements just described in connection with FIG. 4 are labeled with the same numbers in FIG. 4. As shown in FIG. 5, memory cell 400 includes a thin film ferroelectric layer 500 of strontium bismuth niobium tantalate having an empirical formula according to Formula (1) above. A wafer 502 may be any wafer including ruby, sapphire, quartz, or gallium arsenide, but is most preferably a commercially available silicon wafer having a thick oxide isolation layer 504. Wafer 502 is doped to provide source/drain regions 408 and 410. Layer 506 is an isolation layer that is preferably made of spin-on glass. Electrode 412 is preferably made of sputter-deposited platinum and titanium, i.e., Pt/Ti in thicknesses of 2000 Å/200 Å, but any suitable conductor may be used. electrode 414 is preferably made of 2000 Å thick platinum. Bit line 322A is preferably made of platinum.

The operation of the memory in FIGS. 3 through 5 is as follows. Row address signals $A_0$ through $A_6$ (see FIG. 3) and column address signals $A_7$ through $A_{13}$ placed on lines 302 are multiplexed by address registers 324 and 326 utilizing the RAS* and CAS* signals, and passed to the row decoder 308 and column decoder/data input/output multiplexer 312, respectively. The row decoder 308 places a high signal on the one of the wordlines 318 that is addressed. The column decoder/data input output multiplexer 318 either places the data signal which is input on line 328 on the one of the bit lines 322 corresponding to the column address, or outputs on the data line 328 the signal on the one of the bit lines 322 corresponding to the column address, depending on whether the function is a write or read function. As is known in the art, the read function is triggered when the RAS* signal precedes the CAS* signal, and the write function is triggered when the CAS* signal comes before the RAS* signal. The transistors 402 in the respective cells 400 connected to the word line that is high turn on, permitting the data signal on the bit line 322A to be read into the capacitor 404 or the signal on the capacitor 404 to be output on the bit line 322A, depending on whether the read or write function is implemented. As is well-known in the art, the sense amplifiers 320 are located along lines 322 to amplify the signals on the lines. Other logic required or useful to carry out the functions outlined above as well as other known memory functions is also included in the memory 300, but is not shown or discussed as it is not directly applicable to the invention.

As outlined above, the RAS* and CAS* lines 324 and 326; registers 304 and 306; the decoders 308 and 310; and the transistor 402 comprise an information write means 418 (see FIG. 4) for placing the memory cell 400 in a first memory state or a second memory state depending upon information input to the memory on data line 328. The first memory cell state corresponds to layer 500 of ferroelectric material being in a first polarization state, and the second memory cell state corresponds to the layer 500 being in a second polarization state. These components plus sense amplifiers 320 comprise an information read means 420 for sensing the state of memory cell 400 and providing an electrical signal corresponding to the state. The necessity of sensing the polarization state of thin film ferroelectric layer 500 causes information read means to subject thin film ferroelectric layer 500 to repeat unidirectional voltage pulses.

Thin film ferroelectric layer 500 is preferably formed using a liquid deposition process, such as the process described in U.S. Pat. No. 5,423,285, which is hereby incorporated by reference to the same extent as though fully disclosed herein.

Figure 6:
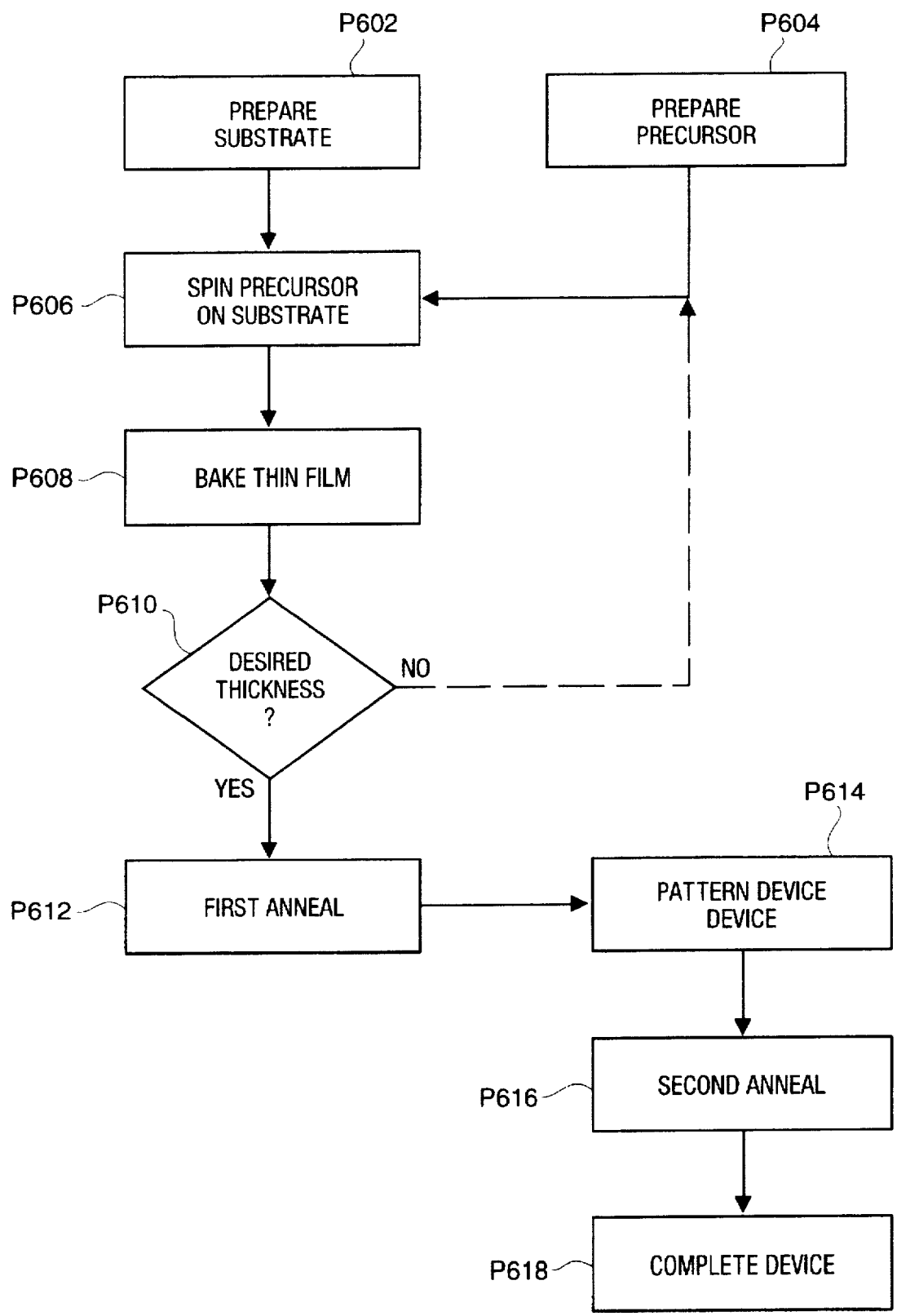
FIG. 6 depicts a schematic process diagram for use in making a memory cell corresponding to the FIG. 5 layered construction.

FIG. 6 depicts a schematic process diagram of process P600 for fabricating memory cell 400 of the present invention. In step P602, wafer 502 is made ready by conventional means to receive thin film ferroelectric layer 500. Accordingly, a silicon wafer 502 may be heated in an oxygen diffusion furnace to grow oxide layer 504. A contact hole 507 may be formed through oxide layer 504 by ion etching or other techniques to expose wafer 502, which is then n or p-doped by conventional means to provide source/drain regions 408 and 410. Gate 406 is formed by conventional means. Isolation layer 506 may be deposited as spin-on glass or other conventional materials. Electrode 412 is sputtered into place and annealed by conventional means. Process P600 differs from conventional processes in the formation of thin film ferroelectric layer 500.

Step P604 includes the preparation of a liquid precursor. It is preferred to use a metal alkoxycarboxylate precursor that is prepared according to the reactions:

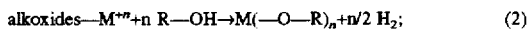

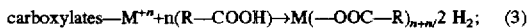

and

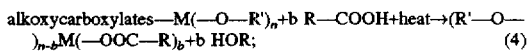

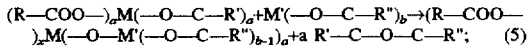

and

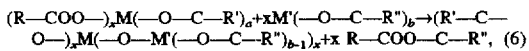

where M is a metal cation having a charge of n; b is a number of moles of carboxylic acid ranging from 0 to n; R' is preferably an alkyl group having from 4 to 15 carbon atoms; R is an alkyl group having from 3 to 9 carbon atoms; R" is an alkyl group preferably having from about zero to sixteen carbons; and a, b, and x are integers denoting relative quantities of corresponding substituents that satisfy the respective valence states of M and M'. M and M' are preferably selected from the group consisting of strontium, bismuth, niobium and tantalum. The exemplary discussion of the reaction process given above is generalized and, therefore, non-limiting. The specific reactions that occur depend on the metals, alcohols, and carboxylic acids used, as well as the amount of heat that is applied. A detailed example of step P604 is provided below as Example 1.

A reaction mixture including an alcohol, a carboxylic acid, and the metals, is refluxed at a temperature ranging from about 70° C. to 200° C. for one to two days, in order to facilitate the reactions. The reaction mixture is then distilled at a temperature above 100° C. to eliminate water and short chain esters from solution. The alcohol is preferably 2-methoxyethanol or 2-methoxypropanol. The carboxylic acid is preferably 2-ethylhexanoic acid. The reaction is preferably conducted in a xylenes or n-octane solvent. The reaction products are diluted to a molarity that will yield from 0.1 to 0.3 moles of the desired strontium bismuth niobium tantalate material (see FIG. 1) per liter of solution.

The strontium bismuth niobium tantalate materials that derive from process P600 work best in their intended environment of use if the liquid precursor solutions of step P604 are mixed to include an excess bismuth amount corresponding to E in Formula (1). Some bismuth volatilization losses occur during the anneal steps P612 and P616. Other advantages of excess bismuth include the compensation of lattice defects. Thin film ferroelectric materials 500 have been prepared to include excess bismuth amounts of 100 percent and more. Excess bismuth is preferably added in an amount ranging from 5% to 10% of the amount of bismuth that is required to satisfy the Smolenskii class A formula which is shown above.

In step P606, the precursor solution from step P604 is applied to the substrate from step P602, which presents the uppermost surface of electrode 412 for receipt of thin film ferroelectric layer 500. Application of the liquid precursor is preferably conducted by dropping one to two ml of the liquid precursor solution at ambient temperature and pressure onto the uppermost surface of electrode 412 and then spinning wafer 502 at up to about 2000 RPM for about 30 seconds to remove any excess solution and leave a thin-film liquid residue. The most preferred spin velocity is 1500 RPM. Alternatively, the liquid precursor may be applied by a misted deposition technique or chemical vapor deposition.

In steps P608 and P610, the precursor is thermally treated to form a solid metal oxide having a mixed layered superlattice structure, i.e., layer 112 on electrode 110. This treating step is conducted by drying and annealing a liquid precursor film that results from step P606. In step P608, the precursor is dried on a hot plate in a dry air atmosphere and at a temperature of from about 200° C. to 500° C. for a sufficient time duration to remove substantially all of the organic materials from the liquid thin film and leave a dried metal oxide residue. This period of time is preferably from about one minute to about thirty minutes. A 400° C. drying temperature for a duration of about two to ten minutes in air is most preferred. This high temperature drying step is essential in obtaining predictable or repeatable electronic properties in the final strontium bismuth niobium tantalate materials crystalline compositions to be derived from process P600.

In step P610, if the resultant dried precursor residue from step P608 is not of the desired thickness, then steps P606 and P608 are repeated until the desired thickness is obtained. A thickness of about 1800 Å typically requires two coats of a 0.130M solution under the parameters disclosed herein.

In step P612, the dried precursor residue is annealed to form the strontium bismuth niobium tantalate thin film ferroelectric layer 500 (see FIG. 5). This annealing step is referred to as the first anneal to distinguish it from a later annealing step. The first anneal is preferably performed in oxygen at a temperature of from 500° C. to 1000° C. for a time from 30 minutes to 2 hours. Step P612 is more preferably performed at from 750° C. to 850° C. for 80 minutes, with the most preferred anneal temperature being about 800° C. The first anneal of step P612 most preferably occurs in an oxygen atmosphere using an 80 minute push/pull process including 5 minutes for the "push" into the furnace and 5 minutes for the "pull" out of the furnace. The indicated anneal times include the time that is used to create thermal ramps into and out of the furnace.

In step P614, the second electrode 414 is deposited by sputtering. The device is then patterned by a conventional photoetching process including the application of a photoresist followed by ion etching, as will be understood by those skilled in the art. This patterning preferably occurs before the second annealing step P616 so that the second anneal will serve to remove patterning stresses from memory cell 400 and correct any defects that are created by the patterning procedure.

The second annealing step, P616, is preferably conducted in like manner with the first anneal in step P612, taking care not to vary the annealing temperature by an amount greater than a small temperature range of from about 50° C. to 100° C. with respect to the first (e.g., 800° C.) annealing temperature. The time for the second anneal is preferably from about twenty to ninety minutes in duration, and a duration of about 30 minutes is most preferred.

Finally, in step P618 the device is completed and evaluated. The completion may entail the deposition of additional layers, ion etching of contact holes, and other conventional procedures, as will be understood by those skilled in the art. Wafer 502 may be sawed into separate units to separate a plurality of integrated circuit devices that have been simultaneously produced thereon.

The following non-limiting examples set forth preferred materials and methods for practicing the invention hereof.

EXAMPLE 1

Production of a 0.14M Metal-Alkoxycarboxylate Solution Designed to Yield $SrBi_{2.18}(Nb_{0.56}Ta_{1.44})O_{9.27}$ Solution ingredients were measured as set forth in Table 1 for use in preparing a precursor solution according to step P604 of FIG. 6. These ingredients were used to make a liquid precursor solution capable of forming a perovskite-like layered superlattice material having an average formula of $SrBi_{2.18}(Nb_{0.56}Ta_{1.44})O_{9.27}$ upon annealing of a dried solution residue in oxygen. The procedure of this example was conducted at atmospheric pressure in a laboratory at Symetrix Corporation in Colorado Springs, Colo.

TABLE 1

| PRECURSOR REAGENTS | | | | |
|---|---|---|---|---|
| Compound | FW | g | mmole | Equiv. |
| Tantalum (V) ethoxide | 406.25 | 11.70 | 28.8 | 1.44 |
| Niobium (V) ethoxide | 318.21 | 3.564 | 11.2 | 0.56 |
| 1-methoxy-2-propanol | 90.12 | 40 ml | 408 | |
| 2-ethylhexanoic acid | 144.21 | 30.0 | 208.0 | — |
| Strontium | 87.62 | 1.752 | 20.0 | 2.00 |
| Bismuth 2-ethylhexanoate (in 22% octane) | 949.77 | 41.41 | 43.6 | 2.18 |

In Table 1, "FW" indicates formula weight, "g" indicates grams, "mmoles" indicates millimoles, and "Equiv." indicates the equivalent formula molarity corresponding to the empirical formula $SrBi_{2.18}(Nb_{0.56}Ta_{1.44})O_{9.27}$. It is noted that a 9%(or 0.18 mole) excess amount of bismuth has been added to compensate for bismuth volatilization losses that are anticipated in the anneal steps P612 and P616 of FIG. 6. Thus, the final strontium bismuth niobium tantalate material could have an empirical formula of $SrBi_2(Nb_{0.56}Ta_{1.44})O_9$, but the precursor solution itself is capable of yielding $SrBi_{2.18}(Nb_{0.56}Ta_{1.44})O_{9.27}$ in the absence of volatilization. An oxygen environment in the anneal steps also supplies whatever portion of the oxygen in the empirical formula that the precursor solution does not supply. Thus, the metals Sr, Bi, Nb, and Ta are mixed in proportions that are intended to yield, upon annealing of the solution, a solid metal oxide having the empirical formula $SrBi_2(Nb_{0.56}Ta_{1.44})O_9$.

An Erlenmeyer flask equipped with a reflux condenser was used to combine the strontium (1.752 g) for reaction with a large excess amount (40 ml) of 1-methoxy-2-propanol to form a reaction mixture. Tantalum (V) ethoxide (11.70 g) and niobium (V) ethoxide (3.564 g) were combined with the reaction mixture. The reaction mixture was refluxed with magnetic stirring at 120° C. for three hours to dissolve and react the strontium metal with the 1-methoxy-2-propanol. The 2-ethylhexanoic acid (30.0 g) was added to the hot reaction mixture, which was again refluxed at 130° C. for an additional three hours. This second refluxing assisted an exothermic substitution of 2-etylhexanoate ligands for alkoxide ligands on the respective metals. This substitution produced metal alkoxycarboxylates. The reaction mixture was evaporated at a temperature ranging from 50° C. to 120° C. under aspiration vacuum to remove about 20 ml of solvent. The solution stood for cooling to room temperature. The bismuth-2-etylhexanoate (41.41 g) was added along with sufficient xylenes to adjust the solution concentration to 0.14 mmol of $SrBi_{2.18}(Nb_{0.56}Ta_{1.44})O_x$ per liter.

EXAMPLE 2

Unidirectional Pulse Testing of a Strontium Bismuth Niobium Tantalate Ferroelectric Capacitor at Room Temperature A plurality of ferroelectric capacitors 404 of the type shown in FIG. 5 were formed on a silicon wafer 502 having a thick oxide layer 504, a Pt/Ti electrode 412, and a Pt top electrode 414. The thin film ferroelectric material 500 was prepared from a liquid precursor that was made according to Example 1 using the most preferred process conditions for the FIG. 6 process. Thus, the thin film ferroelectric layer 500 had an empirical formula $SrBi_{2.18}(Nb_{0.56}Ta_{1.44})O_{9.27}$ or $SrBi_2(Nb_{0.56}Ta_{1.44})O_9$ depending upon volatilization losses. Each capacitor had a surface area of 7854 square microns and a thickness of about 1800 Å.

A Hewlit Packard 8115A dual channel pulse generator and a Hewlit Packard 54502A digitizing oscilloscope were connected to a 11.1 nf load resistor. Probes were positioned to contact the silicon wafer and the top electrode 414 for conducting PUND switching measurements. PUND switching curves are measured in terms of seconds versus current in amps/cm$^2$.

Figure 7:
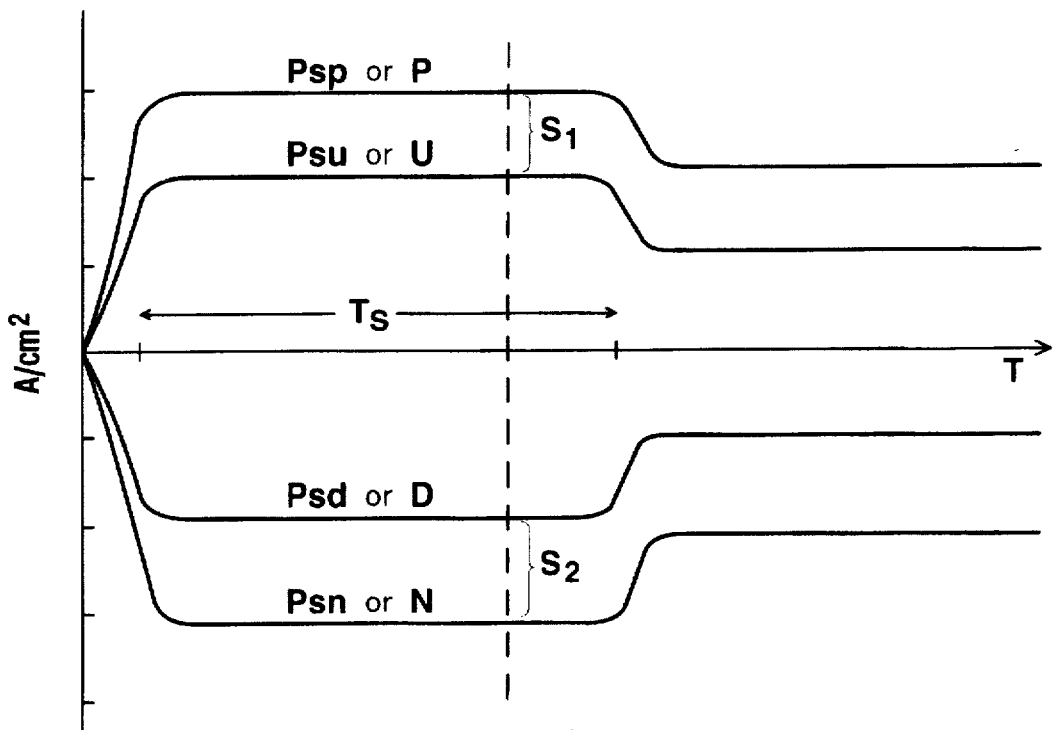
FIG. 7 depicts a schematic representation of a conventional PUND measurement with reference to standard nomenclature used to describe features of PUND measurements.

As shown in FIG. 7, the PUND curves are generated in a well-known manner by first initializing the sample with two pulses in the negative direction, then measuring the charge across a load capacitor for a series of four voltage pulses that give the measurement it's name: a positive (P) pulse, a second positive of up (U) pulse, a negative (N) pulse, and then another negative or down (D) pulse. All pulses have the same absolute amplitude. The initial negative pulses make sure the material starts with a negative polarization by switching from a linear dielectreic pattern to a nonlinear ferroelectric pattern as domains in the virgin ferroelectric material become oriented to the applied field. The first positive, "Psp" or "P", pulse therefore switches the material to a positive polarization along side 104 of curve 100 (see FIG. 1). Since the sample is already polarized positively with a remanent ferroelectric charge +Pr, the second pulse "Psu" or "U" measures the change from linear dielectric loss between the remanent polarization Pr and the spontaneous polarization Ps in the positive direction. Likewise the "Psn" or "N" pulse measures the negative switched charge, and the "Psd" or "D" pulse measures the change from linear dielectric loss between the remanent polarization −Pr and the spontaneous polarization −Ps in the negative direction. One effect of imprinting is to impair memory readout by shifting the Psp and Psu curves towards or away from 0 A/cm$^2$. Another effect is loss of the ability to store data in more than one state because the ferroelectric material can no longer retain two memory polarization states once the Psd or Psu curves reach a value of 0 A/cm$^2$.

For a standard architecture of a memory cell (but not for all architectures) the PUND curves indicate the suitability of the material for a non-volatile ferroelectric switching memory application. Generally, it is desirable that the "P" and "N" curves are well-separated from the "U" and "D" curves, respectively, which provides a large signal in the standard architecture. It is also desirable that all the curves fall quickly to a low value after a saturation time Ts. A curve that falls quickly indicates the material rapidly completes the current flow, which produces the signal quickly. That is, it is a "fast switching" material. Generally, in the tests herein, the switching time is taken to be the time to fall to a value of 10% of the maximum amplitude, since this 10% level will generally be within the noise level of a typical integrated circuit.

Figure 1:
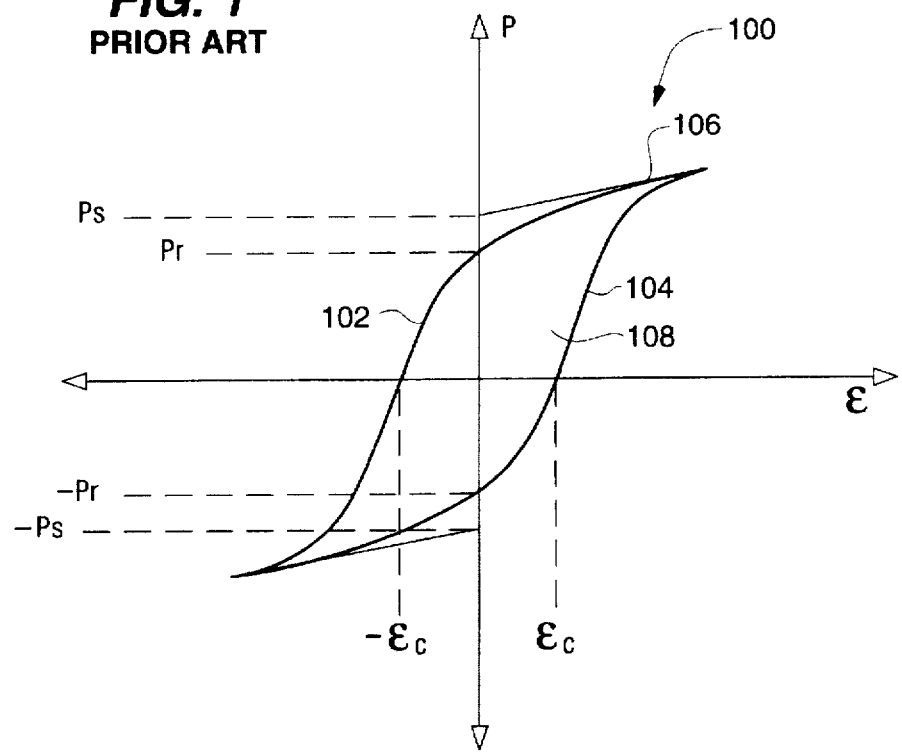
FIG. 1 depicts an idealized conventional ferroelectric polarization hysteresis curve with reference to conventional nomenclature used to describe aspects of the curve.
Figure 2:
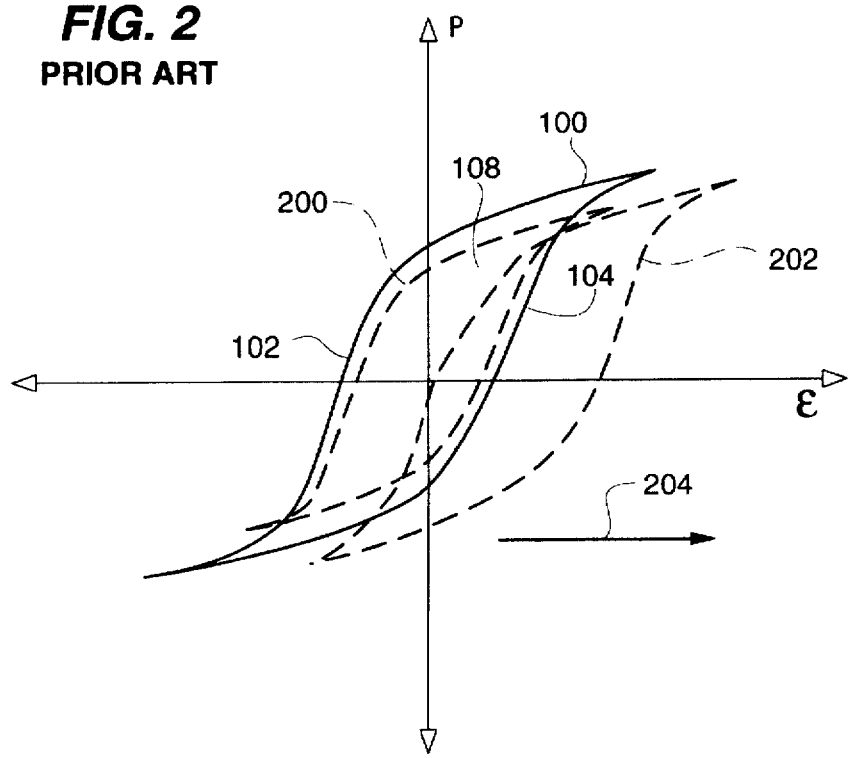
FIG. 2 depicts the idealized FIG. 1 curve adjacent other curves demonstrating polarization fatigue and polarization imprint problems.

PUND measurements were conducted using a switching pulse amplitude of three volts with a rise time of 30 nanoseconds, a fall time of thirty nanoseconds, and a pulse width of one microsecond with a pulse delay of 75 nanoseconds between pulses. PUND measurements were conducted in a test lab at a temperature of 25° C. and ambient atmospheric pressure in Colorado Springs, Colo. The initial positive direction travel in hysteresis according to FIG. 1 showed a polarization value of 21.2 µC/cm$^2$ determined as Psp-Psd or P-D with respect to FIG. 7. The negative direction switching thereafter showed a Psn-Psu or U-D polarization of −20.38 µC/cm$^2$. These initial values were normalized to 100, e.g., as by multiplying 21.2 by the factor 100/21.2. Accordingly, subsequent measurements multiplied by these same factors express imprint-based changes in terms of a percentage of the initial measurements.

After the virgin PUND measurements, the PUND measurement apparatus was used to deliver 10$^8$ unidirectional square-wave voltage pulse cycles to the ferroelectric capacitor 404. The pulses each had an amplitude of 3 volts, and were delivered at 1 MHZ cycle with a negative polarity to the negatively switched ferroelectric capacitor. PUND switching measurements conducted after 10$^8$ cycles, and produced a Psp-Psd value of 22.25 and a Psn-Psu value of −20.71, which normalized to 109.18 and −97.69, respectively. The ferroelectric capacitor was subjected to additional unidirectional voltage pulses, and additional PUND measurements were taken as before after 10$^9$ cumulative cycles. The process was repeated for measurements at 10$^{10}$ cumulative cycles.

Figure 8:
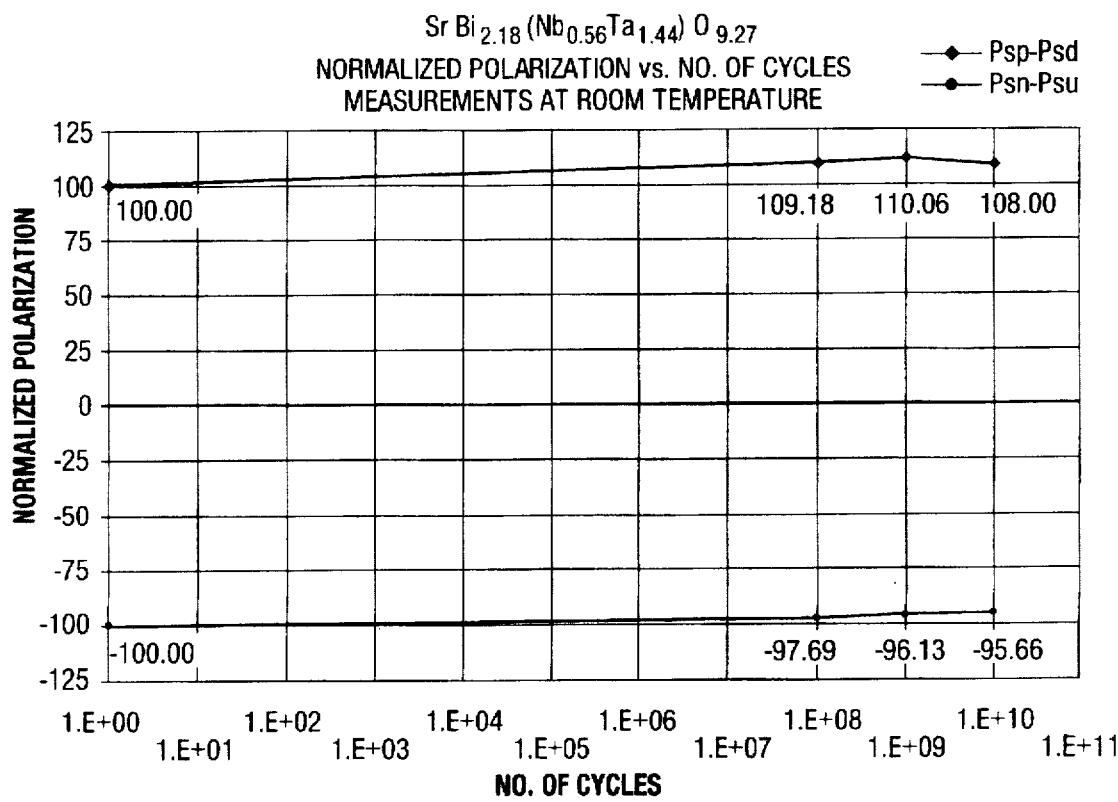
FIG. 8 depicts PUND switching results obtained from thin film strontium bismuth niobium tantalate materials according to the present invention.

FIG. 8 depicts the PUND switching results for the SrBi$_{2.18}$(Nb$_{0.56}$Ta$_{1.44}$)O$_{9.27}$ material as normalized polarization versus number of unidirectional pulse cycles on a log scale. The normalized Psn-Psu imprint values ranged from −97.69 to −95.66 or less than five percent of the virgin polarization. The normalized Psp-Psd imprint values ranged from 109.18 to 110.06 and actually improved from 110.06 at 10$^9$ cycles to 108.00 at 10$^{10}$ cycles, i.e., these values stayed within about ten percent of the virgin polarization value. The FIG. 8 results show exceptionally good resistance to imprint. No other thin film materials are known to resist imprint as well as the SrBi$_{2.18}$(Nb$_{0.56}$Ta$_{1.44}$)O$_{9.27}$ material.

COMPARATIVE EXAMPLE 2

Unidirectional Pulse Testing of a Strontium Bismuth Tantalate Ferroelectric Capacitor at Room Temperature A precursor solution was prepared in an identical manner with respect to Example 1, except an equivalent molar amount of tantalum was substituted for the niobium. The solution was, accordingly, designed to yield SrBi$_{2.18}$Ta$_2$O$_{9.27}$ in the FIG. 6 process. This solution was used to make a plurality of ferroelectric capacitors on a wafer in an identical manner with respect to Example 2, except that the capacitors were made of SrBi$_{2.18}$Ta$_2$O$_{9.27}$. A representative ferroelectric capacitor was subjected to identical PUND measurements with respect to the PUND measurements of Example 2.

Figure 9:
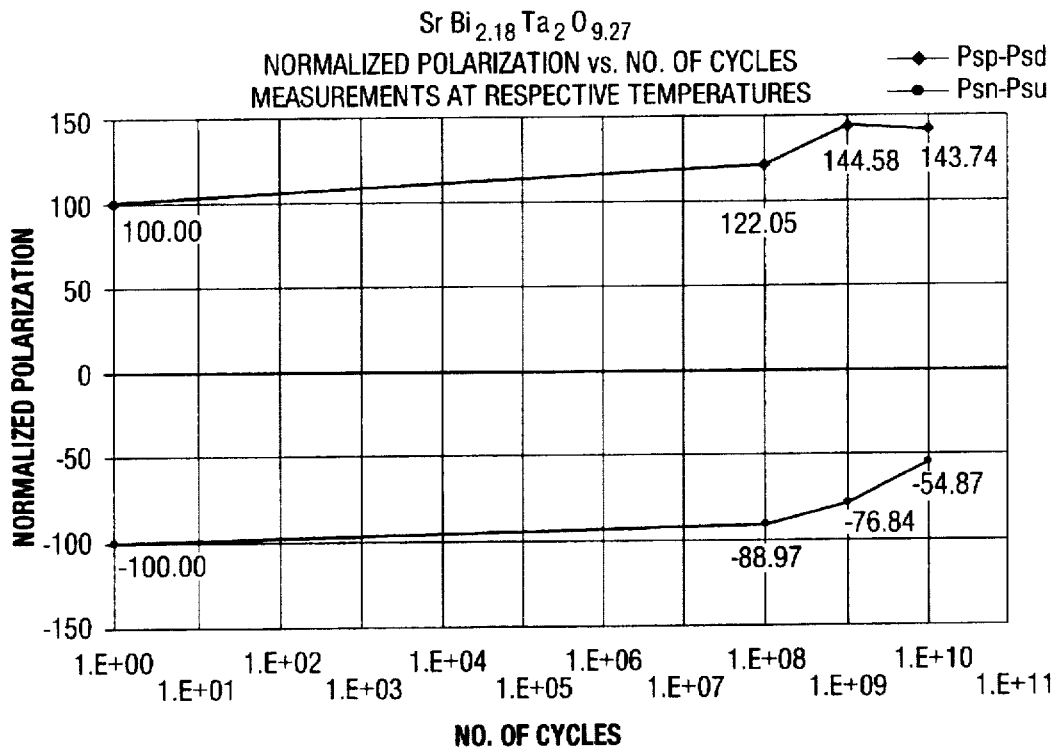
FIG. 9 depicts room temperature PUND switching results obtained from thin film strontium bismuth tantalate materials for comparison against the FIG. 8 results.

FIG. 9 depicts the PUND switching results for the SrBi$_{2.18}$Ta$_2$O$_{9.27}$ material as normalized polarization versus number of cycles on a log scale. The normalized Psn-Psu imprint values ranged from −88.97 to −54.87 or about forty five percent of the virgin polarization. The normalized Psp-Psd imprint values ranged from 122.05 to 144.58 and slightly improved from 144.58 at 10$^9$ cycles to 143.74 at 10$^{10}$ cycles, i.e., these values stayed within about forty five percent of the virgin polarization value. The FIG. 9 imprint results are still very good, but are comparatively poor in comparison to the FIG. 8 results.

EXAMPLE 3

Unidirectional Pulse Testing of a Strontium Bismuth Niobium Tantalate Ferroelectric Capacitor at Elevated Temperature The PUND measurements of Example 2 were repeated in an identical manner on an identical ferroelectric capacitor, except the measurements were conducted at 125° C., as opposed to 25° C. The test temperature was changed to provide a more realistic assessment of conditions in the intended environment of use, i.e., in an integrated memory circuit.

Figure 10:
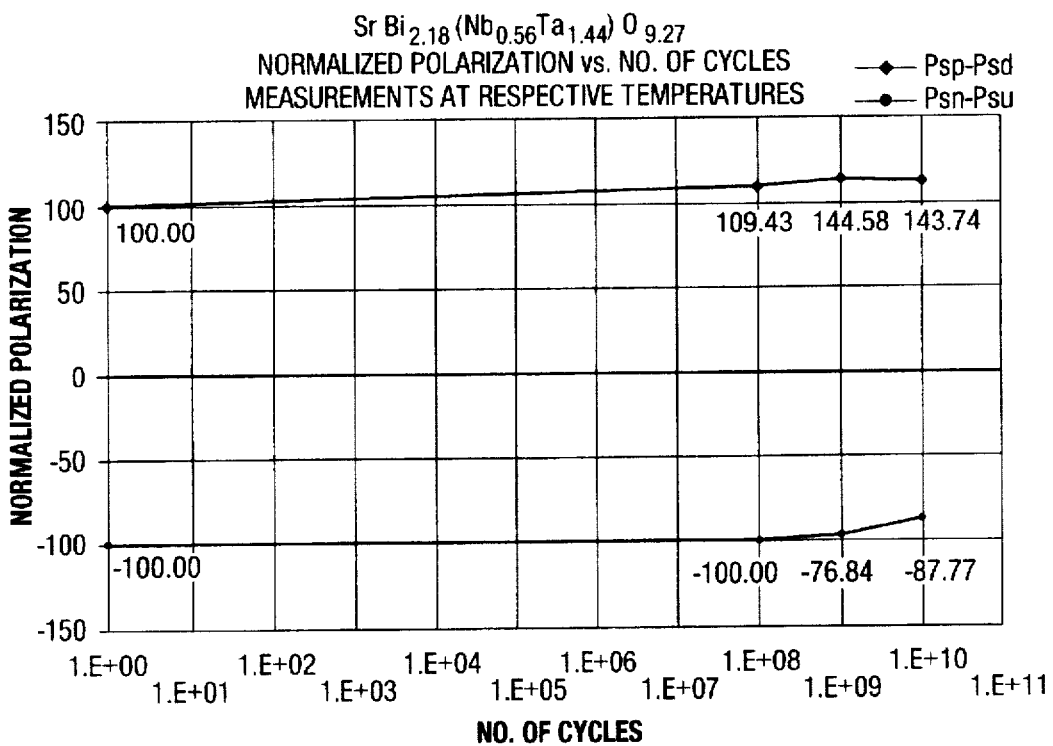
FIG. 10 depicts elevated temperature (125° C.) PUND switching results obtained from thin film strontium bismuth niobium tantalate materials according to the present invention.

FIG. 10 shows the PUND measurement results as normalized polarization versus number of cycles on a log scale. The normalized polarization was computed with respect to measurements conducted on virgin materials at 125° C.

The normalized Psn-Psu imprint values ranged from −100.00 to −87.77 or less than thirteen percent of the virgin polarization. The normalized Psp-Psd imprint values ranged from 109.43 to 113.13 and actually improved from 113.13 at 10$^9$ cycles to 112.12 at 10$^{10}$ cycles, i.e., these values stayed within about seventeen percent of the virgin polarization value. The FIG. 10 results show exceptionally good resistance to imprint at high temperature, despite the fact that imprint is more pronounced at high temperature.

EXAMPLE 4

Figure 11:
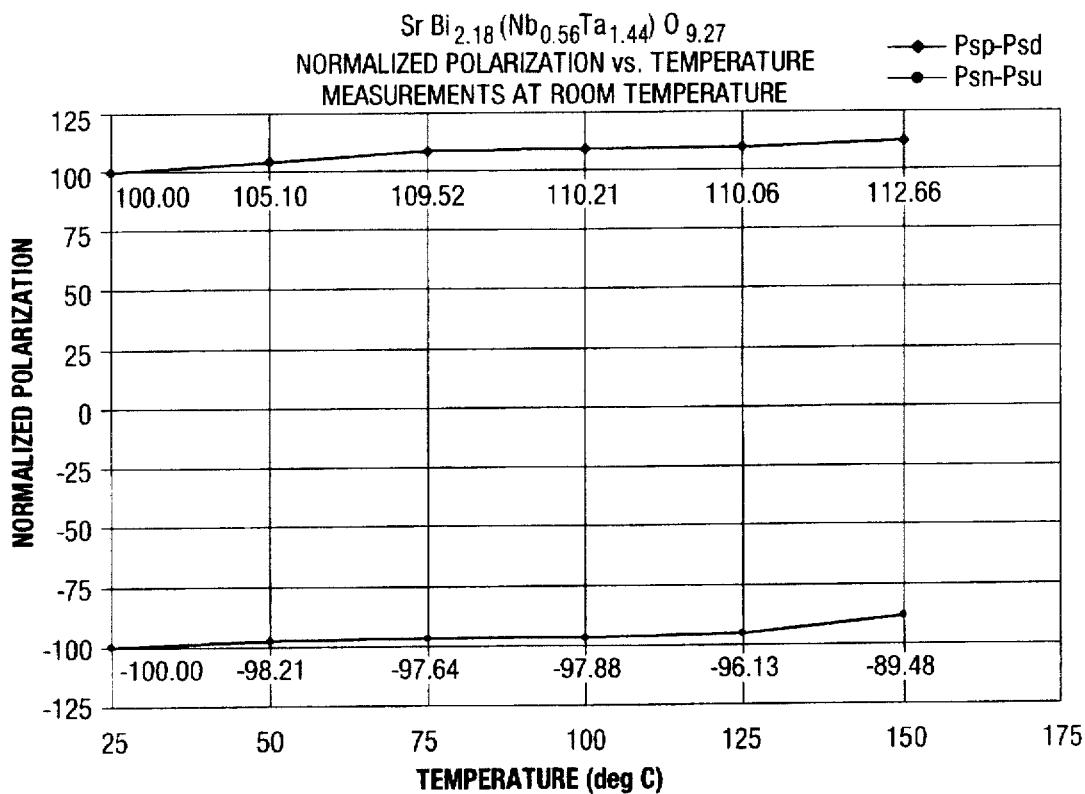
FIG. 11 depicts the sensitivity of near virgin PUND measurements to temperature for thin film strontium bismuth niobium tantalate materials according to the present invention.

The Effect of Elevated Temperatures on PUND Measurements for Strontium Bismuth Niobium Tantalate Successive PUND measurements were conducted on a plurality of ferroelectric capacitors made of SrBi$_{2.18}$(Nb$_{0.56}$Ta$_{1.44}$)O$_{9.27}$ material in an identical manner with resect to the PUND measurements of Example 1. Each capacitor was held at a constant temperature while the negative 3V unidirectional pulses were cycled 10$^9$ times to challenge the SrBi$_{2.18}$(Nb$_{0.56}$Ta$_{1.44}$)O$_{9.27}$ material in each capacitor. Individual capacitors were tested at 25° C., 50° C., 75° C., 100° C., 125° C., and 150° C. FIG. 11 shows the PUND measurement results as normalized polarization versus the temperature corresponding to each capacitor. The normalized polarization was computed with respect to measurements conducted on the 25° C material. The normalized Psn-Psu values ranged from −100.00 to −89.48, and decreased in magnitude with respect to temperature. FIG. 11 shows that elevated temperatures above 125° C. accelerate imprint.

COMPARATIVE EXAMPLE 4

Figure 12:
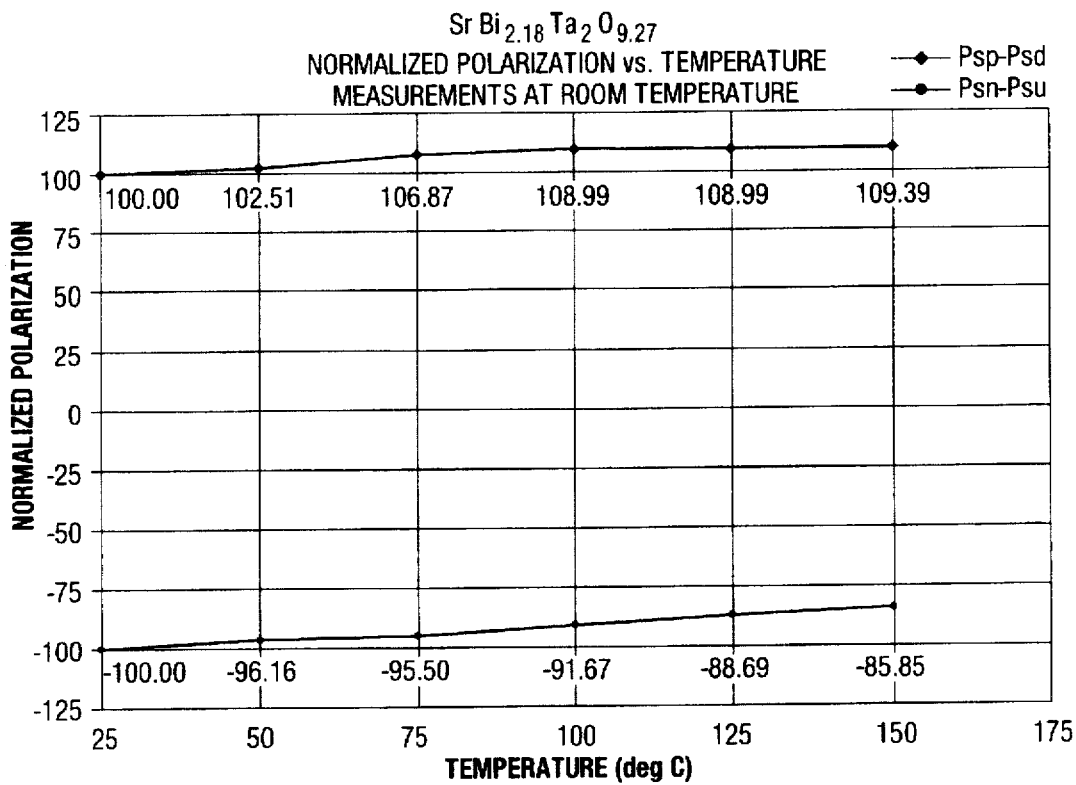
FIG. 12 depicts the sensitivity of near virgin PUND measurements to temperature for thin film strontium bismuth tantalate materials n comparison against the FIG. 11 results.

The Effect of Elevated Temperatures on PUND Measurements for Strontium Bismuth Tantalate The PUND measurements of Example 4 were repeated on a SrBi$_{2.18}$Ta$_2$O$_{9.27}$ ferroelectric capacitor that was made according to Comparative Example 2. FIG. 12 depicts the PUND results for comparison against FIG. 11. The FIG. 12 results are, overall, quite good. The FIG. 12 Psp-Psd results are better than the corresponding results in FIG. 11, while the Psn-Psu results in FIG. 11 are not as good as the comparable results in FIG. 11. The Psn-Psu measurements represent an opposite state or memory retention state and, consequently, are the most sensitive to imprinting effects. The FIG. 12 Psn-Psu measurements go towards zero more rapidly than do the FIG. 11 results at temperatures above 100° C. This acceleration shows that the $SrBi_{2.18}Ta_2O_{9.27}$ materials are relatively less well suited for high temperature operations than are the $SrBi_{2.18}(Nb_{0.56}Ta_{1.44})O_{9.27}$ materials.

Those skilled in the art will understand that the preferred embodiments described above may be subjected to apparent modifications without departing from the true scope and spirit of the invention. The inventors, accordingly, hereby state their intention to rely upon the Doctrine of Equivalents, in order to protect their full rights in the invention.

We claim:

1. In an electronic device having a thin film ferroelectric material, the improvement wherein said thin film ferroelectric material comprises:

strontium bismuth niobium tantalate having an empirical formula $$SrBi_{2+E}(Nb_xTa_{2-x})O_{9+3E/2},$$

wherein E is a number representing an excess amount of bismuth ranging from zero to 2; and X is number representing an amount of niobium ranging from 0.01 to 0.9, said thin film ferroelectric material having a thickness of less than about 6000 Å.

2. The electronic device of claim 1 wherein said thin film ferroelectric material is capable of withstanding at least $10^{10}$ unidirectional voltage pulse cycles each having a magnitude ranging from three to five volts with less than 20% imprint determined as Psn-Psu.

3. The electronic device of claim 1 wherein said thin film ferroelectric material is capable of withstanding at least $10^9$ unidirectional voltage pulse cycles each having a magnitude ranging from three to five volts with less than 5% imprint determined as Psn-Psu.

4. The electronic device of claim 1 wherein X ranges from 0.4 to 0.8.

5. The electronic device of claim 1 wherein X is 0.56.

6. The electronic device of claim 1 further includes an integrated memory circuit and means for coupling said thin film ferroelectric material with said integrated memory circuit.

7. The electronic device as set forth in claim 6 wherein said integrated memory circuit is a FERAM.

8. The electronic device as set forth in claim 7 wherein said coupling means includes wiring operably contacting said thin film ferroelectric material to incorporate said thin film ferroelectric material in a ferroelectric capacitor in said FERAM.

* * * * *